(12) United States Patent  (10) Patent No.: US 8,710,643 B2
Kang et al.  (45) Date of Patent: Apr. 29, 2014

(54) ELECTRONIC PACKAGE WITH FLUID FLOW BARRIERS

(75) Inventors: Teck-Gyu Kang, San Jose, CA (US); Yuan Li, Sunnyvale, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/019,815

(22) Filed: Feb. 2, 2011

(65) Prior Publication Data

US 2011/0204476 A1  Aug. 25, 2011

Related U.S. Application Data

(62) Division of application No. 11/742,521, filed on Apr. 30, 2007, now Pat. No. 7,883,937.

(51) Int. Cl.
*H01L 23/22* (2006.01)
(52) U.S. Cl.
USPC ........................................... 257/687; 438/108
(58) Field of Classification Search
CPC ............. H01L 2924/1515; H01L 2924/15151; H01L 2924/16315
USPC ..................................... 438/108; 257/532, 687
See application file for complete search history.

(56) References Cited

U.S. PATENT DOCUMENTS

| 6,291,264 | B1 * | 9/2001 | Tang et al. | 438/106 |
| 6,614,122 | B1 * | 9/2003 | Dory et al. | 257/787 |
| 7,384,818 | B2 * | 6/2008 | Kim et al. | 438/108 |
| 2002/0060368 | A1 * | 5/2002 | Jiang | 257/778 |
| 2008/0130241 | A1 * | 6/2008 | Nagar et al. | 361/719 |

* cited by examiner

*Primary Examiner* — Shaun Campbell
(74) *Attorney, Agent, or Firm* — Womble Carlyle Sandridge & Rice LLP

(57) ABSTRACT

The present invention is directed to a method and electronic computer package that is formed by placing an integrated circuit, having a plurality of bonding pads with solder bumps deposited thereon, in contact with the substrate so that one of the plurality of solder bumps is in superimposition with respect to one of the contacts and one of the plurality of bonding pads, with a volume being defined between region of the substrate in superimposition with the integrated circuit. A portion of the volume is filled with a quantity of underfill. A fluid flow bather is formed on the substrate and defines a perimeter of the volume, defining a flow restricted region. The fluid flow barrier has dimensions sufficient to control the quantity of underfill egressing from the flow restricted region.

16 Claims, 2 Drawing Sheets

ELECTRONIC PACKAGE WITH FLUID FLOW BARRIERS

CLAIM OF PRIORITY

This application is a Divisional of and claims priority from U.S. patent application Ser. No. 11/742,521 filed on Apr. 30, 2007 now U.S. Pat. No. 7,883,937 and entitled "Electronic Package and Method of Forming the Same", which is hereby incorporated by reference in its entirety.

BACKGROUND

The present invention relates to integrated circuit packages and more particularly to chip-scale packages (CSPs) incorporating interposers to confine movement of material over of a substrate upon which devices of the CSP are mounted.

Typically the final process in the manufacture of an integrated circuit, packaging of the integrated circuit is attendant with several challenges that may prevent obtaining the intended operational characteristics of the integrated circuit. Packaging of an integrated circuit involves mechanically mounting the integrated circuit to the package and providing electrical connections between the integrated circuit and conductors of the package, typically called pins, to facilitate signal and power transmission between the integrated circuits and circuits outside of the package.

A common packaging technology is known as "flip chip" and includes mechanically and electrically coupling an integrated circuit to a substrate, which is capable of producing a chip package having a high pin count while providing a modest package area. A common type of flip chip package structure includes the so-called "flip chip ball grid array". In a flip chip ball grid array package an array of bonding pads is present on an active surface of the integrated circuit and conductive bumps are formed over the bonding pads. Thereafter, the chip is flipped over such that the contacts on a substrate are aligned with the respective bumps on the chip. A reflow process is commonly employed when fabricating flip chip packages. The reflow process allows allow the bumps on the surface to melt and bond with corresponding contacts on the substrate. Thus, the substrate and the chip are electrically and mechanically connected via the bumps so that the chip is able to communicate with an external device through the internal circuits inside the substrate. However, the differences in the coefficient of thermally expansion between the differing materials employed to fabricate the flip chip has proven problematic.

A need exist, therefore, to provide improved flip chip packaging techniques.

SUMMARY

It should be appreciated that the present invention can be implemented in numerous ways, such as a process and a package. Several inventive embodiments of the present invention are described below.

The present invention is directed to a method and electronic computer package that is formed by placing an integrated circuit, having a plurality of bonding pads with solder bumps deposited thereon, in contact with a substrate so that one of the plurality of solder bumps is in superimposition with respect to one of the contacts and one of the plurality of bonding pads, with a volume being defined between a region of the substrate in superimposition with the integrated circuit. A portion of the volume is filled with a quantity of underfill. A fluid flow bather is formed on the substrate and defines a perimeter of the volume, defining a flow restricted region. The fluid flow barrier has dimensions sufficient to control the quantity of underfill egressing from the flow restricted region. In one embodiment, the fluid flow bather is formed by depositing solder mask material upon the substrate. Another embodiment forms the fluid flow barrier by depositing solder upon the aid substrate, and yet another embodiment forms the fluid flow barrier by providing a recess in the substrate. These and other aspects of the invention will become apparent from the following detailed description, taken in conjunction with the accompanying drawings, illustrating by way of example the principles of the invention.

DETAILED DESCRIPTION OF THE INVENTION

Figure 1:
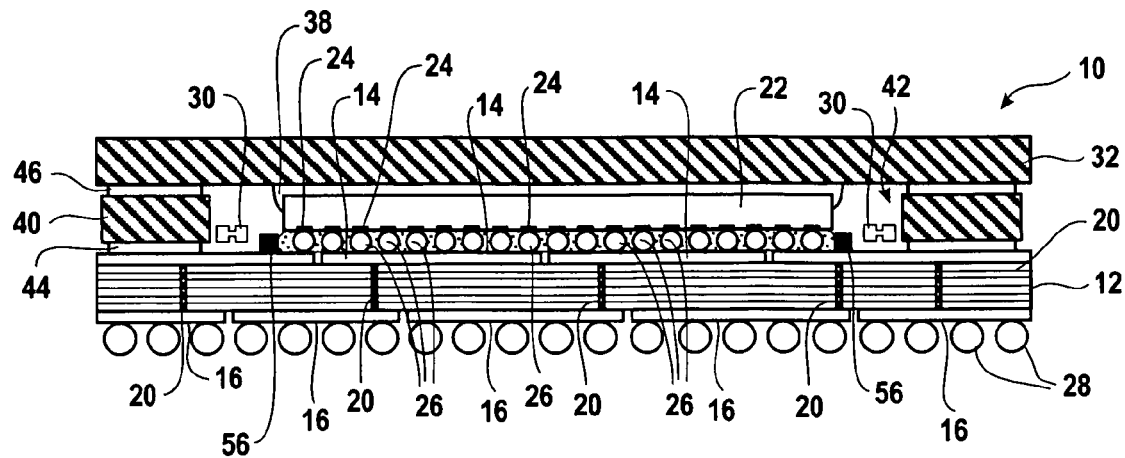
FIG. 1 is a simplified cross-sectional view of an integrated circuit assembly in accordance to one embodiment of the present invention.

Referring to FIG. 1, an integrated circuit package 10 is shown as including a substrate 12 having a plurality of integrated circuit contact pads 14 disposed upon one side thereof. A plurality of output contact pads 16 is disposed on a side of substrate 12 that is opposite to the side upon which integrated circuit contact pads 14 are disposed. Conductive vias 20 place different subsets of integrated circuit contact pads 14 in electrical communication with different subsets of output contact pads 16. An integrated circuit 22 includes a plurality of bonding pads 24. Integrated circuit 22 is mechanically and electrically coupled to substrate 12 by solder bumps 26 disposed between bonding pads 24 in contact pads 14, using techniques well known in the art, discussed further below. Signals from integrated circuit 12 are transmitted outside of integrated circuit package 10 by solder bumps 28 that are attached to and in electrical communication with contact pads 16.

Typically integrated circuit package 10 includes additional discrete components 30 to facilitate operation of integrated circuit 22. Mechanical protection of integrated circuit 22 is afforded by virtue of the presence of a lid 32 that extends to cover the entire area of integrated circuit 22 as well as discrete components 30. Integrated circuit 22 provides mechanical support for lid 32 by the presence of underfill material 34 that fills a void defined by integrated circuit 22 and the regions of substrate 12 and superimposition therewith. Disposed between integrated circuit 22 and lid 32 is an adhesive layer 38, which together with lid 32 and integrated circuit 22 provides mechanical support therebetween.

To provide mechanical support in two regions of lid 32 not in superimposition with integrated circuit 22, a stiffener layer 40 provided. Stiffener layer 40 is positioned between a substrate 12 and lid 32. Stiffener layer 40 may be form from any suitable material and includes a centrally disposed throughway 42, a portion of which is in superimposition with regions of substrate 12 in which discrete components 30 are present. Adhesive layer 44 fixedly attaches stiffener layer 40 to substrate 12, and adhesive layer 46 fixedly attaches lid 32 to stiffener layer 40. As a result, flow barrier 56 defines a flow restricted region 55, shown in FIG. 3, and operated to control the quantity of underfill 34 that egresses from flow restricted region 55 during a reflow process.

A problem overcome by the present invention concerns the reflow process that is typically employed in flip hip technology to securely fasten solder bumps 26 to contact pads 14. As is well known, the temperature employed during the reflow process is sufficiently close to the melting temperature of underfill 34, such that underfill 34 often flows during the reflow process. This has deleterious effects on discrete components 30.

Figure 2:
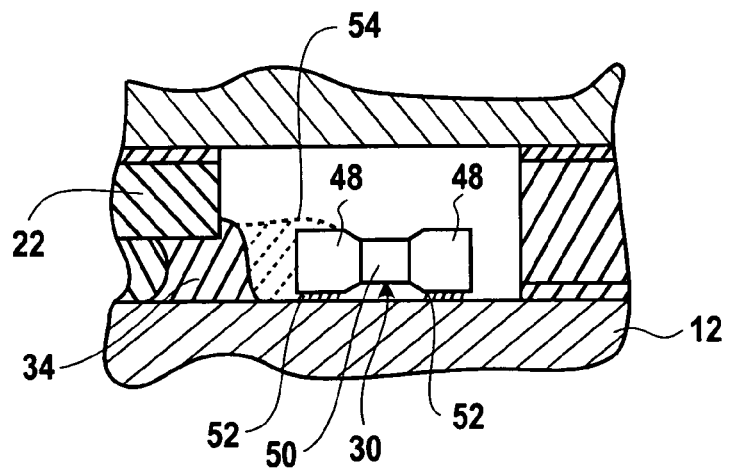
FIG. 2 a detailed plan view of a decoupling capacitor module, shown in FIG. 1 in accordance with the present invention.

As shown in FIG. 2, an example of a discrete component 30 is a capacitor having opposed conductive contacts 48 with dielectric material 50 extending therebetween. Conductive contacts 48 are attached to conductive regions of substrate 12 using solder 52. As a result of the reflow process, a portion 54 of underfill 34 overlaps a portion of conductive contacts 48 closest to integrated circuit 22. The overlapping underfill 54 is known to generate sufficient thermal energy during the reflow process so as to melt solder 52 in superimposition therewith. This causes solder 52 to flow between opposed conductive contacts 48, effectively shorting together the opposed ends dielectric material 50. To prevent overlapping underfill 54 from reaching discrete components 30, a fluid flow bather 56 is present on substrate 12. Specifically, fluid flow barrier 56 is provided with dimensions sufficient to prevent underfill 34 from contacting discrete components 30 during a reflow process.

Figure 3:
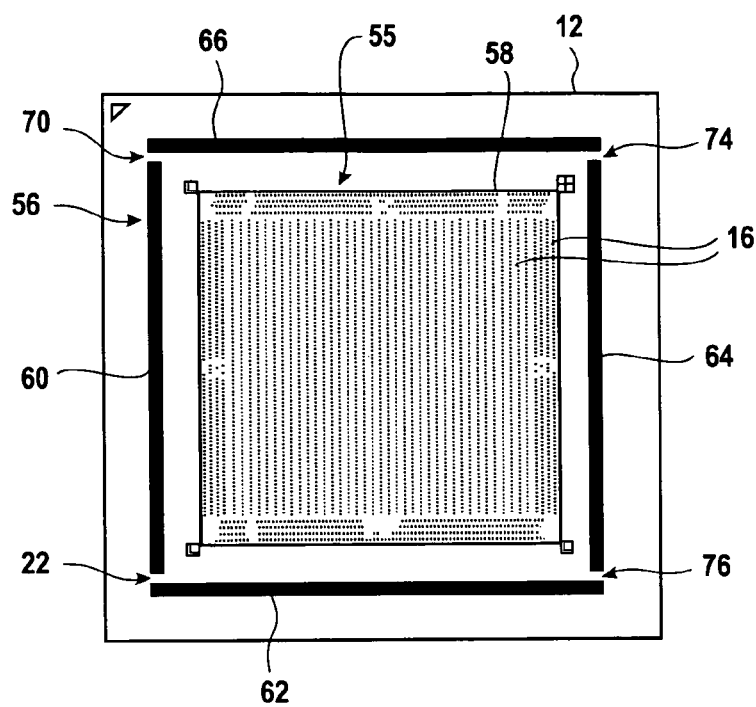
FIG. 3 is a top down plan view of a substrate included in the integrated circuit shown in FIG. 1.

Referring to FIG. 3, as shown substrate 12 includes contact region 58 in which circuit contact pads 14 are disposed. Fluid flow barrier 56 includes four spaced-part baffles 60, 62, 64 and 66. Baffle 60 extends parallel to baffle 64 and transversely to both baffle 66 and 62. Baffle 60 is disposed proximate to, and space-depart from, an end of baffle 66 and extends therefrom toward baffle 62 terminating proximate to and space-apart from baffle 62. Similarly, baffle 62 is dispose proximate to, and space-apart from one end of baffle 64, extending therefrom terminating proximate to baffle 60. One end of baffle 66 is disposed proximate to, and spaced-apart from, an end of baffle 64 that is disposed opposite to baffle 62. Baffle 66 extends from baffle 64, terminating proximate to baffle 60. With this configuration four hiatuses 70, 72, 74 and 76 are formed in fluid flow barrier 56.

Referring to both FIGS. 2 and 3, the dimensions of each of baffles 60, 62, 64 and 66, as well as dimensions of each hiatus 70, 72, 74 and 76, are established based upon the viscosity of underfill 34, when heated to the reflow temperatures, so that the surface tension of underfill 34 will prevent the same from either traversing across baffle 60, 62, 64 and 66 and/or propagating through hiatuses 70, 72, 74 and 76 due to capillary action with baffles 60, 62, 64 and 66. Thus, by establishing dimensions of flow barrier 56 based upon the flow characteristics of underfill 34, e.g., viscosity of the same at the temperature of the reflow process, as well as the quantity of underfill 34 present, the amount of underfill egressing from flow restricted region 55 may be controlled. For example, the dimensions of baffles 60, 62, 64 and 66, as well as the dimension of hiatuses 70, 72, 74 and 76 may be established to prevent any portion of underfill 34 from egressing from flow restricted region 55. Alternatively, the dimensions of baffles 60, 62, 64 and 66, as well as the dimension of hiatuses 70, 72, 74 and 76 may be established to allow a sub-portion of the quantity of underfill 34 to egress from flow restricted region 55 while preventing the same from contacting peripheral devices 30. In addition, the dimensions of baffles 60, 62, 64 and 66, as well as the dimension of hiatuses 70, 72, 74 and 76 may be established to allow a sub-portion of the quantity of underfill 34 to egress from flow restricted region 55 and contact peripheral devices 30 with the quantity being established to preclude generation of sufficient thermal energy to cause solder 52 to flow sufficient to short-circuit peripheral devices 30.

Although fluid flow bather 56 has been described as being formed from solder mask material, the same maybe formed from printable epoxy, solder, or any other suitable material. If desire, the solder material from which fluid flow barrier 56 is formed may have a melting temperature that is higher than the melting temperature of solder bumps 26 and/or solder bumps 28, shown in FIG. 1. In this matter, fluid flow barrier 56 would not melt sufficiently to complete operation of fluid flow barrier 56 to prevent underflow 34 from reaching discrete components 30 during a reflow process, as described above.

Figure 4:
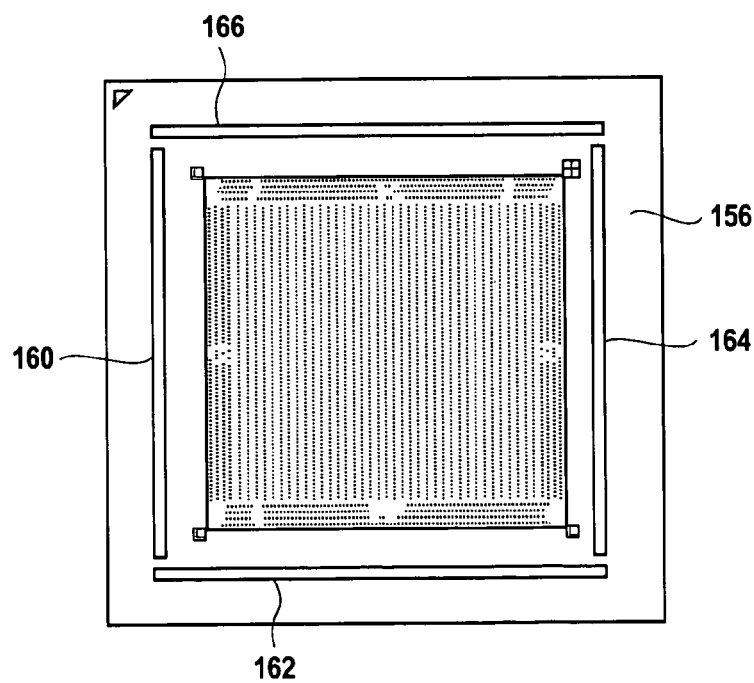
FIG. 4 is a top down plan view of the substrate shown in FIG. 4 in accordance with an alternate embodiment of the present invention.

Referring to FIG. 4, another embodiment of fluid flow bather 156 is form by substituting baffle 60, 62, 64 and 66 with trenches 160, 162, 164 and 166 respectfully.

Although the foregoing invention has been described in some detail for purposes of clarity of understanding, it will be apparent that certain changes and modifications may be practiced within the scope of the appended claims. Accordingly, the present embodiments described above are to be considered as illustrative and not restrictive, and the invention is not to be limited to the details given herein, but may defined by the appended claims, including full scope of equivalents thereof.

What is claimed is:

1. An electronic package comprising:
  a substrate having a plurality of contacts;
  an integrated circuit mounted to said substrate with solder bumps extending between bonding pads of said integrated circuit and a sub-portion of said plurality of contacts;
  a quantity of underfill deposited in a void defined between said integrated circuit and regions of said substrate in superimposition therewith;
  a plurality of capacitors solder attached to portions of said substrate lying outside of said regions;
  a fluid flow barrier formed on said substrate, wherein the fluid flow barrier comprises a plurality of baffles each extending above a surface of said substrate, wherein the fluid flow barrier is formed between said regions and said capacitors, and wherein dimensions of the fluid flow barrier are defined to allow a sub-portion of the quantity of underfill to egress from said regions and traverse completely across a top surface of an outermost baffle of the fluid flow barrier while preventing the sub-portion from contacting said capacitors during thermal heating of said package to facilitate reflow of said solder bumps.

2. The package as recited in claim 1 wherein said fluid flow barrier is formed from a recess formed into said substrate.

3. The package as recited in claim 1 wherein said fluid flow barrier surrounds said regions.

4. An electronic package with fluid flow barriers comprising:
  a substrate having a plurality of fluid flow barriers, the fluid flow barriers including,
    a plurality of baffles extending above the substrate, the plurality of baffles composed of solder mask material deposited upon the substrate, wherein dimensions of the baffles are defined to allow a sub-portion of a quantity of underfill to traverse from a flow restricted region completely across a top surface of an outermost baffle, while preventing the sub-portion from reaching a nearby passive component.

5. The electronic package of claim 4 further comprising:
a plurality of capacitors solder attached to portions of the substrate lying outside of the fluid flow barriers.

6. The electronic package of claim 4 further comprising:
a plurality of contact pads disposed on a surface of the substrate.

7. The electronic package of claim 6 further comprising:
an integrated circuit mounted to the substrate, the integrated circuit having a plurality of bonding pads and solder bumps extending between bonding pads and a subset of the plurality of contact pads.

8. The electronic package of claim 7, further comprising:
a quantity of underfill filling a void defined between the integrated circuit and the substrate.

9. The electronic package of claim 7, wherein signals from the integrated circuit are transmitted by solder bumps in electrical communication with the contact pads.

10. The electronic package of claim 8 wherein underflow characteristics include viscosity of underfill at a temperature when said quantity of underfill is flowing.

11. The electronic package of claim 8 wherein dimensions of said fluid flow barrier are defined based on underfill flow characteristics.

12. An electronic package comprising:
an integrated circuit having a plurality of pads with solder bumps deposited, the integrated circuit in contact with a substrate with a plurality of contact pads so that one of the plurality of solder bumps is in superimposition to one of the contact pads and one of the plurality of pads;
a plurality of capacitors disposed adjacent to the integrated circuit; and
a fluid flow barrier located between the integrated circuit and the plurality of capacitors, wherein dimensions of the fluid flow barrier are defined to allow a sub-portion of a quantity of underfill to traverse completely across a top surface of an outermost baffle of the fluid flow barrier while preventing the sub-portion from contacting the plurality of capacitors.

13. The electronic package of claim 12, wherein the fluid flow barrier comprises:
a plurality of baffles extending above a substrate on which the integrated circuit is mounted, the fluid flow barrier fabricated from solder mask material deposited upon the substrate.

14. The electronic package of claim 12, wherein the fluid flow barrier comprises:
a plurality of baffles extending above a substrate on which the integrated circuit is mounted, the fluid flow barrier fabricated from solder deposited upon the substrate.

15. The electronic package of claim 12, wherein the fluid flow barrier comprises:
a plurality of baffles extending above a substrate on which the integrated circuit is mounted, the fluid flow barrier fabricated from printable epoxy deposited on the substrate.

16. The electronic package of claim 13, wherein the fluid flow barrier comprises:
a hiatus separating adjacent baffles, the hiatus having dimensions to prevent a quantity of underfill from flowing outside the fluid flow barriers through capillary action.

* * * * *